(12) United States Patent
Xiao (10) Patent No.: US 9,484,111 B2
(45) Date of Patent: Nov. 1, 2016

(54) BIDIRECTIONAL SCANNING GOA CIRCUIT

(71) Applicant: SHENZHEN CHINA STAR OPTOELECTRONICS TECHNOLOGY CO., LTD., Shenzhen (CN)

(72) Inventor: Juncheng Xiao, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 146 days.

(21) Appl. No.: 14/418,753

(22) PCT Filed: Jan. 13, 2015

(86) PCT No.: PCT/CN2015/070642
§ 371 (c)(1),
(2) Date: Jan. 30, 2015

(87) PCT Pub. No.: WO2016/106847
PCT Pub. Date: Jul. 7, 2016

(65) Prior Publication Data
US 2016/0189649 A1    Jun. 30, 2016

(51) Int. Cl.
*G09G 3/36* (2006.01)
*G09G 5/00* (2006.01)
*G11C 19/00* (2006.01)

(52) U.S. Cl.
CPC ............. *G11C 19/00* (2013.01); *G09G 3/3677* (2013.01); *G09G 2300/0408* (2013.01); *G09G 2310/0283* (2013.01); *G09G 2310/0286* (2013.01); *G09G 2310/08* (2013.01)

(58) Field of Classification Search
CPC ............... G11C 19/00; G09G 3/3677; G09G 2310/0286; G09G 2310/0283; G09G 2310/08; G09G 2300/0408
USPC ...................................... 345/87–92, 212–215
See application file for complete search history.

(56) References Cited

U.S. PATENT DOCUMENTS

2012/0008731 A1    1/2012   Hsu et al.
2013/0335392 A1*  12/2013   Cho ......................... H03K 3/00
                                                                345/211

(Continued)

FOREIGN PATENT DOCUMENTS

CN    102842278 A    12/2012
CN    102867477 A     1/2013

(Continued)

OTHER PUBLICATIONS

Office Action issued in Chinese Application No. 201410841923.X; Dated Jun. 2, 2016 (8 pages).

*Primary Examiner* — Amit Chatly
(74) *Attorney, Agent, or Firm* — Osha Liang LLP (57) ABSTRACT

A GOA circuit for use in LCD applications is disclosed, and the GOA circuit includes multiple cascaded GOA units, each of which includes a pull-up control circuit, a pull-up circuit, a pull down circuit, a pull-down holding circuit, a reset circuit, and a bootstrap capacitor. By using the GOA circuit, scanning directions of the LCD display panel are controlled by introducing scanning control signals to the pull-up control circuit for determining to output gate signals of the GOA circuit in sequence of up-to-down stages or in sequence of down-to-up stages. Furthermore, a novel scheme of three-segment voltage division achieves the optimization and the stability of the GOA circuit.

9 Claims, 7 Drawing Sheets

(56) References Cited

U.S. PATENT DOCUMENTS

2014/0103983 A1* 4/2014 Chang ............... G09G 3/3655
 327/198
2015/0279288 A1* 10/2015 Dai .................... G02F 1/13306
 345/690
2016/0086562 A1* 3/2016 Tan .................... G09G 3/3677
 345/215

FOREIGN PATENT DOCUMENTS

| CN | 104008739 A | 8/2014 |
| CN | 201410841923 | 6/2016 |

* cited by examiner

BIDIRECTIONAL SCANNING GOA CIRCUIT

BACKGROUND OF THE INVENTION

1. Field of the Invention

The present invention relates to liquid crystal display (LCD) technology, and more particularly to a GOA (Gate Driver on Array) circuit for LCD applications and LCD devices.

2. Description of Prior Art

In recent years, GOA technology has started to be applied to a manufacturing process of LCD display panels, and it has replaced the original manufacturing process, which originally used external integration circuits (IC) as a means to implement a driving function for horizontal scanning of LCD display panels by forming driver circuits on the circumference of a display area of a substrate. GOA technology is able to reduce the amount of external ICs and packaging procedures such that the costs of flat panel displays can be reduced. At the same time, a narrow-bezel panel that has features such as being lightweight, thin, and a symmetrical look can be carried out and a more compact display module is advantageous due to the possibility of simplifying the design of the drain driving circuits, the increased resolution of a display panel, and the application in flexible display panels.

The existing GOA circuits typically include multiple cascaded GOA units, and each GOA unit corresponds to driving one-stage horizontal scanning line. The GOA unit includes a pull-up circuit, a pull-up control circuit, a transferring circuit, a pull-down holding circuit, and a bootstrap capacitor. The pull-up circuit is mainly responsible for outputting a gate (Gate) signal which is used for driving GOA circuit by inputting a clock pulse sequence (Clock) and using a control circuit to control a timing of the activation of the pull-up circuit. The pull-up control circuit is usually connected to a transfer signal or a Gate signal delivered from a preceding-stage GOA unit. The pull-down circuit is responsible for pulling down the Gate signal to be configured in a low electric potential at the first timing segment, namely, the Gate signal is turned off. The pull-down holding circuit is responsible for maintaining the Gate output signal and a Gate signal point (commonly referred to as "Q point", hereinafter called as "key node Q") of the pull-up circuit in negative electric potential. Furthermore, a bootstrap capacitor is used for secondarily lifting a voltage of the Q point to be instrumental to the gate output of the pull-up circuit.

Even though the existing GOA circuits have adopted the design of three-segment voltage division in the pull-down holding circuit, the stability problems of the GOA circuits that are especially caused by the stability of circuit components is still a big issue in display devices. On the other hand, there are diverse needs for scanning means of a display apparatus.

SUMMARY OF THE INVENTION

It is an object of the present invention to provide a GOA circuit for use in LCD applications with a bi-directional scanning function, and the GOA circuit includes multiple cascaded GOA units in which each GOA unit includes a pull-up control circuit, a pull-up circuit, a pull down circuit, a pull-down holding circuit, a reset circuit and a bootstrap capacitor. By configuring the pull-up control circuit within the GOA unit, the GOA circuits for use in LCD applications with a bi-directional scanning function can be carried out such that the starting signal of the GOA circuits in the backward direction can be activated to drive a GOA circuit in operation even if the starting signal of the GOA circuit in the forward direction fails.

The present invention introduces a forward scanning control signal and a backward scanning control signal and use their DC level to charge the key node Q, and the two scanning control signals are equal to two signals which are opposite in a frame. In this manner, the impact due to a delay resulting from a cascaded delivery signal on the charge performance of the key node Q can be avoided.

According to the first aspect of the present invention, A bidirectional scanning GOA circuit for use in an LCD device including multiple cascaded GOA units, each of which generates one or more scanning signals outputted to the LCD device, the GOA unit comprising:

a pull-up control circuit including a forward scanning control signal input port configured to input a scanning control signal that controls the circuit to output in sequence of up-to-down stages, a backward scanning control signal input port configured to input a scanning control signal that controls the circuit to output in sequence of down-to-up stages, a plurality of gate signal input ports configured to receive a gate signal of a preceding-stage GOA unit and a gate signal of a succeeding-stage GOA unit, and an output port configured to output a pull-up control signal;

a pull-up circuit including an input port connected with a key node Q(N), configured to receive the pull-up control signal, a clock signal input port configured to receive a clock pulse signal and a gate signal output port of the current stage GOA unit, wherein the pull-up control signal is formed in accordance with the scanning control signals of the pull-up control circuit and the gate signal transmitted from either the preceding-stage GOA unit or the succeeding-stage GOA unit, upon forward scanning, the pull-up circuit is activated to charge the key node Q(N) when the gate signal transmitted from the preceding-stage GOA unit configured in a HIGH electric potential, and upon backward scanning, the pull-up circuit is activated to charge the key node Q(N) when the gate signal of the succeeding-stage GOA unit configured in a HIGH electric potential;

a bootstrap circuit including a bootstrap capacitor configured to secondarily lift a voltage of the key node Q(N);

a pull down circuit including a gate signal input port configured to receive the gate signal transmitted from the succeeding-stage GOA unit, a low voltage input port configured to input a DC low voltage, and an output port connected with the key node Q(N), and discharge the key node Q(N) when the gate signal input port receives the gate signal transmitted from the succeeding-stage GOA unit;

a pull-down holding circuit including a plurality of first clock signal input ports configured to input the first clock signals, a plurality of second clock signal input ports configured to input the second clock signals, and a plurality of connection points configured to connect the key node Q(N) with the signal output port of the GOA unit to sustain an electric potential of the key node Q(N) and the output signal of the GOA unit in LOW electric potentials, under the control of the first clock signal and the second clock signal, until the key node Q(N) is charged next time, wherein the signal output port of the GOA unit is coupled to a corresponding gate line; and a reset circuit configured for resetting the electric potential of the key node Q(N) to zero.

According to the second aspect of the present invention, a GOA circuit for use in an LCD device including multiple cascaded GOA units, each of which generates one or more scanning signals outputted to the LCD device, the GOA unit comprising:

a pull-up control circuit including a first transistor and a second transistor connected in series, wherein a drain of the first transistor and a source of the second transistor are respectively connected with to introduce a scanning control signal that controls the circuit to output in sequence of up-to-down stages as well as a scanning control signal that controls the circuit to output in sequence of down-to-up stages, and a gate of the first transistor and a gate of the second transistor are respectively connected with to receive a gate signal of a preceding-stage GOA unit and a gate signal of a succeeding-stage GOA unit;

a pull-up circuit having a drain, which receives a clock pulse signal, and a gate, which a key node is connected with the source of the first transistor and the drain of the second transistors, for charging a voltage of the key node Q(N) and controlling a timing of activating the pull-up circuit to output the gate signal of the N stage GOA unit in accordance with the scanning control signals and the received gate signal of the preceding-stage GOA unit or the succeeding-stage GOA unit, wherein the gate signal of the N stage GOA unit corresponds to a horizontal scanning line of the N stage GOA unit;

a bootstrap capacitor configured for secondarily lifting the voltage of the key node Q(N);

a pull down circuit having a drain and a source respectively connected with the key node Q(N) and a DC low voltage input, and a gate connected to receive the output signal of the succeeding-stage GOA unit for discharging the key node Q(N);

a pull-down holding circuit including a third transistor and a fourth transistor for inputting a first clock signal as well as a fifth transistor and a sixth transistor for inputting a second clock signal, wherein the first clock signal and the second signal are inverse with each other, and the key node Q(N) and the gate output signal are sustained in LOW electric potentials, under the control of the first clock signal and the second clock signal, until the key node Q(N) is charged next time; and a reset circuit configured for resetting the electric potential of the key node Q(N) to zero.

According to the third aspect of the present invention, the present invention also provides an LCD display device comprising a GOA circuit with a bi-directional scanning function.

The advantage of the present invention is not only to provide a GOA circuit with a bi-directional scanning function for fulfilling a diverse scanning means for LCD applications, but also the pull-down holding circuit of the provided GOA unit is ensured to have the appropriate electric potentials during operation or non-operation to effectively sustain the electric potentials of the key node Q(N) and the output gate signal G(N) in Low electric potentials by adding transistors to the pull-down holding circuit so as to achieving the optimization and the stability of the GOA circuit.

These and various other features as well as advantages, which characterize the disclosure presented herein, will be apparent from a reading of the following detailed description and a review of the associated drawings.

DETAILED DESCRIPTION OF THE INVENTION

The preferred embodiments of the present invention will be detailed in the following in combination with the accompanying drawings. The drawings are drawn schematically, and do not limit the protection scope thereof, and the same reference numbers are used to indicate the same or similar components throughout the drawings. Spatially relative terms, such as "above", "beneath", "upper", "lower", "left", "right", "inner", "outer", and the like may be used herein for ease of description to describe one element's relationship to another element(s) as illustrated in the figures, rather than its restrictions.

Figure 1:
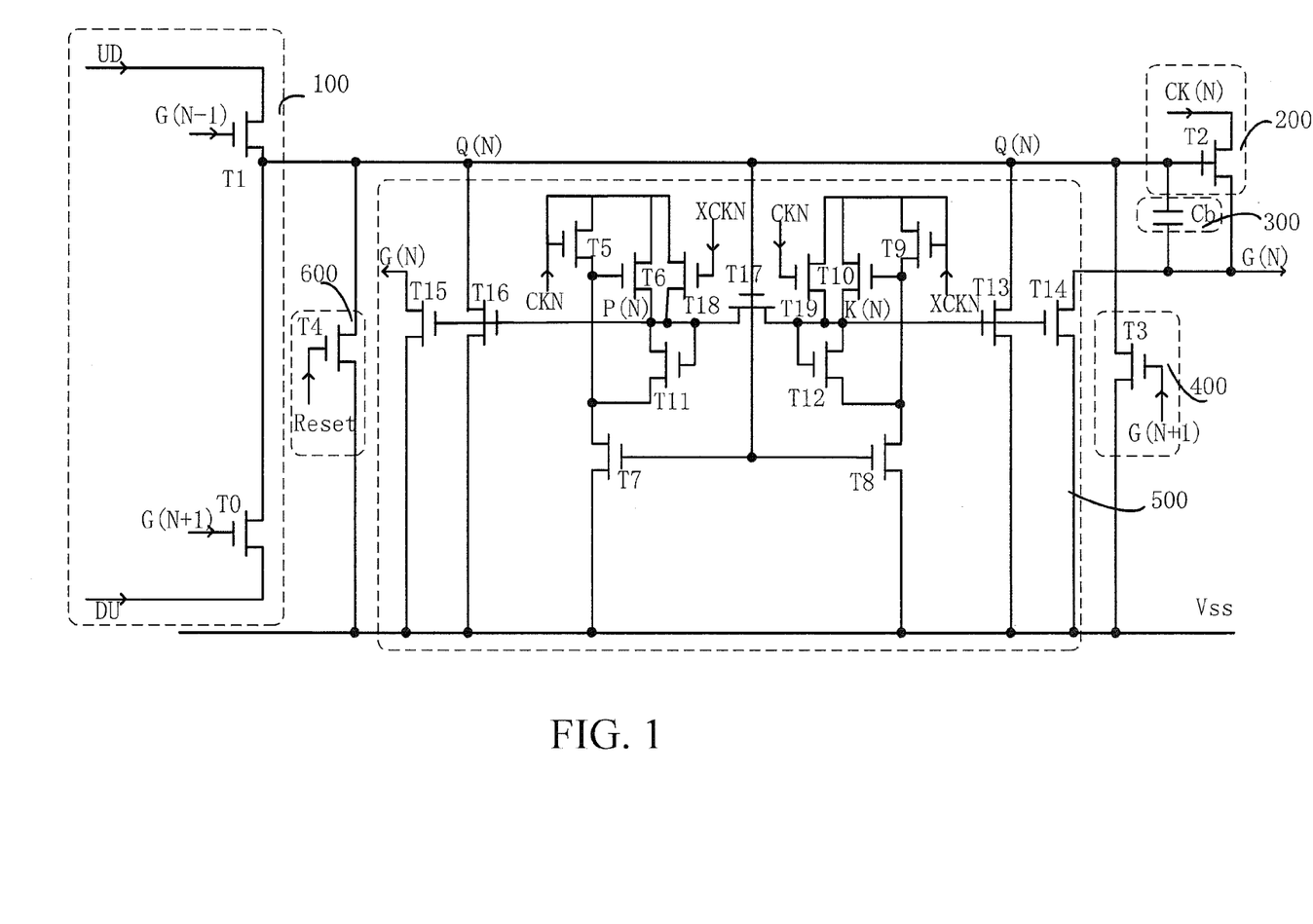
FIG. 1 is a schematic circuit diagram of a GOA unit in accordance with the first embodiment of the present invention.

With reference to FIG. 1, a GOA unit for use in LCD applications is illustrated according to the first embodiment of the present invention. The GOA circuits includes multiple cascaded GOA units, and the N-stage GOA unit includes a pull-up control circuit 100, a pull-up circuit 200, a pull down circuit 400, a pull-down holding circuit 500, a reset circuit 600, and a bootstrap capacitor 300 (Cb). As shown in FIG. 1, the pull-up control circuit 100 and the reset circuit 600 are respectively connected with the key node. The pull down circuit 400, the pull-down holding circuit 500 and the bootstrap capacitor (Cb) are respectively connected with the key node and the horizontal scanning line of the N-stage GOA unit G(N). The gate of a transistor T1 of the pull-up control circuit 100 is connected with an output signal of the (N−1) stage GOA unit, i.e. G(N−1), and the source of the transistor T1 of the pull-up control circuit 100 is connected with the key node. The forward scanning control signal UD is introduced to the drain of the transistor T1 of the pull-up control circuit 100. The gate of another transistor T0 of the pull-up control circuit 100 is connected with an output signal of the (N+1) stage GOA unit, i.e. G(N+1), and the drain of the transistor T0 of the pull-up control circuit 100 is connected with the gate point Q(N). The backward scanning signal DU is introduced to the source of the transistor T0 of the pull-up control circuit 100. As shown in FIG. 1, the drain and the source of a transistor T2 of the pull-up circuit 200, respectively, are connected with a clock signal CKN and the horizontal scanning line of the N-stage GOA unit. The gate of a transistor T3 of the pull down circuit 400 is connected with the output signal of the (N+1) stage GOA unit, and the drain and the source of the transistor T3 are respectively connected with the key node, i.e. the key node Q(N), and a DC low voltage input, e.g. Vss. In this manner, the circuit is specially designed for a requirement of a duty cycle of a clock pulse signal, e.g. CK(N), which is preferably less than 50% in order to have the key node Q(N) be charged through a couple of timing segments and allows the key node Q(N) to be discharged immediately. Consequently, the electric potential of the key node Q(N) can be sustained in a proper electric potential no matter whether the pull-down holding circuit 500 is in operation or non-operation. The pull-down holding circuit 500 includes transistors (T5, T19) for operating with the first clock signal CKN and the second clock signal XCKN, and the second clock signal XCKN is an opposite signal of the first clock signal CKN. Under the control of the first clock signal CKN and the second clock signal XCKN, the electric potential of the key node Q(N) and the output signal of the N stage GOA unit G(N), can be sustained in the LOW electric potentials until the key node Q(N) is charged next time.

Upon being operated in a forward scanning mode, the forward scanning control signal UD is configured in the HIGH electric potential while the backward scanning signal DU is configured in the LOW electric potentials to be introduced to the pull-up control circuit. When the output signal of the preceding-stage GOA unit is in the HIGH electric potential and delivered to the current stage GOA unit, the pull-up circuit 200 is activated so that the key mode Q(N) is charged to output a gate signal of the current stage GOA unit G(N) with a HIGH electric potential. Upon being operated in a backward scanning mode, the forward scanning control signal UD is configured in the LOW electric potential while the backward scanning signal DU is configured in the HIGH electric potentials. When the output signal of the succeeding stage GOA unit is in the HIGH electric potential and delivered to the current stage GOA unit, the pull-up circuit 200 is activated so that the key node Q(N) is charged to output a gate signal of the current stage GOA unit with the HIGH electric potential G(N).

As shown in FIG. 1, the pull-down holding circuit 500 includes: a first transistor T15 in which the gate is connected with a first circuit point P(N), and the source and the drain are respectively connected with the horizontal scanning line of the N-stage GOA unit and the DC low voltage input Vss; a second transistor T16 in which the gate is connected with a first circuit point P(N), and the source and the drain are respectively connected with the key node and the DC low voltage input Vss; a third transistor T17 in which the gate is connected with the key node, and the source and the drain are respectively connected with a second circuit point K(N) and the first circuit point P(N); a fourth transistor T18 in which the gate is connected with the second clock signal XCKN, and the source and the drain are respectively connected with the first clock signal CKN and the first circuit point P(N); a fifth transistor T19 in which the gate is connected with the first clock signal CKN, and the source and the drain are respectively connected with the second clock signal XCKN and the second circuit point K(N); a sixth transistor T5 in which the gate is connected with the first circuit point P(N), and the source and the drain are both connected with the first clock signal CKN; a seventh transistor T6 in which the gate is connected with the first circuit point P(N), and the source and the drain are respectively connected with the first clock signal CKN and the first circuit point P(N); an eighth transistor T9 in which the gate is connected with the second circuit point K(N), and the source and the drain are both connected with the second clock signal XCKN; a ninth transistor T10 in which the gate is connected with the second circuit point K(N), and the source and the drain are respectively connected with the second clock signal XCKN and the second circuit point K(N); a tenth transistor T13 in which the gate is connected with the second circuit point K(N), and the source and the drain are respectively connected with the key node and the DC low voltage input Vss; an eleventh transistor T14 in which the gate is connected with the second circuit point K(N), and the source and the drain are respectively connected with the horizontal scanning line of the N-stage GOA unit and the DC low voltage input Vss; a twelfth transistor T11 and a thirteenth transistor T7 being in a series connection, in the twelfth transistor T11 the gate is connected with the first circuit point P(N), and the source and the drain are respectively connected with the first circuit point P(N) and the drain of the thirteenth transistor T7; the thirteenth transistor T7 in which the gate is connected with the key node Q(N), and the source and the drain are respectively connected with the first circuit point P(N) and the DC low voltage input Vss; a fourteenth transistor T12 and a fifteenth transistor T8 being in a series connection, in the fourteenth transistor T12 the gate is connected with the second circuit point K(N), and the source and the drain are respectively connected with the second circuit point K(N) and the drain of the fifteenth transistor T8; and the fifteenth transistor T8 in which the gate is connected with the gate point Q(N) of the pull-up circuit 200, and the source and the drain are respectively connected with the second circuit point K(N) and the DC low voltage input Vss.

The scheme of voltage division in the pull-down holding circuit 500 is a novel design. In particular, the thirteenth transistor T7 and the fifteenth transistor T8 allow the electric potentials of P(N) and K(N) to be lower than the DC low voltage input Vss during operation so that the electric potentials of the key node Q(N) and the output signal of the N stage GOA unit G(N) can be effectively prevented from leaking Simultaneously, the thirteenth transistor T7 and the fifteenth transistor T8 allow the electric potentials of P(N) and K(N) to be provided with appropriate High electric potentials during non-operation so that the electric potentials of the key node Q(N) and the output signal of the N stage GOA unit G(N) can be sustained in Low electric potentials during non-operation. As a result, the GOA circuits can be outputted normally. The electric potentials of P(N) and K(N) are changed along with the change of electric potentials of the first clock signal CKN and the second clock signal XCKN in an alternative way.

As shown in FIG. 1, the transistor T4 of the reset circuit 600 is configured for the purpose of resetting the electric potential of the key node Q(N) to zero so as to prevent from circuit malfunction due to charge accumulation through long term operation. Apart from that, the output signal of the N stage GOA unit is also influenced by charge accumulation through long term operation which results in severe ripples of uncertainty, and the reset operation of the electric potentials of the key node Q(N) performed by the reset circuit 600 can reduce occurrence of such a situation.

Figure 2:
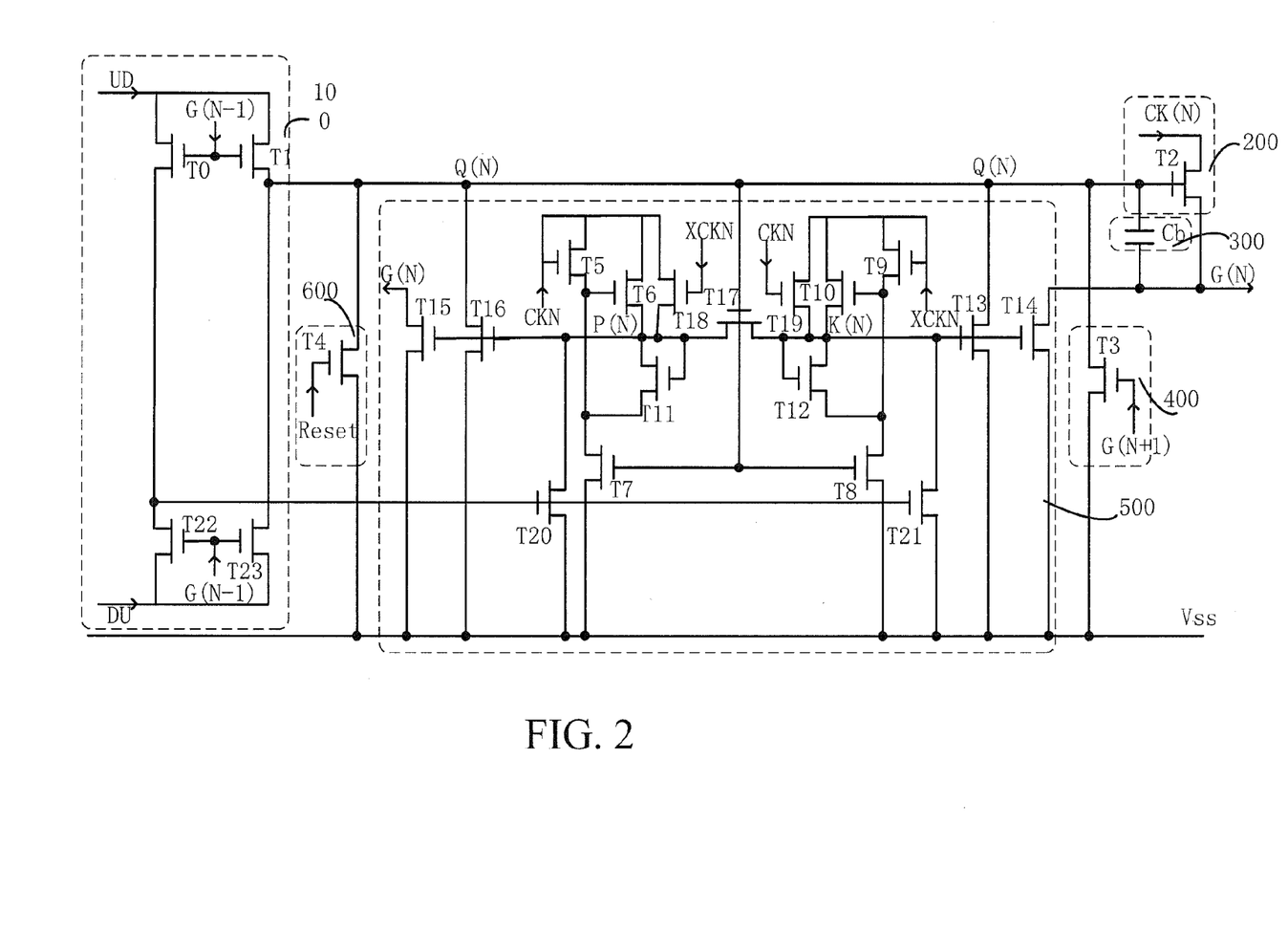
FIG. 2 is a schematic circuit diagram of a GOA unit in accordance with the second embodiment of the present invention.

With reference to FIG. 2, a GOA unit is illustrated according to the second embodiment of the present invention. The second embodiment of the present invention is the GOA unit based on the first embodiment of the present invention shown in FIG. 1, and a modification of the GOA unit is focused on the pull-down holding circuit 500. The transistor T20 and the transistor T21 are added to enhance the electric potentials of the key node Q(N) to be charged at the first timing segment when the electric potentials of P(N) and K(N) are pulled down. In this manner, the risk of malfunction of the pull-down holding circuit can be effectively lowered.

Figure 3:
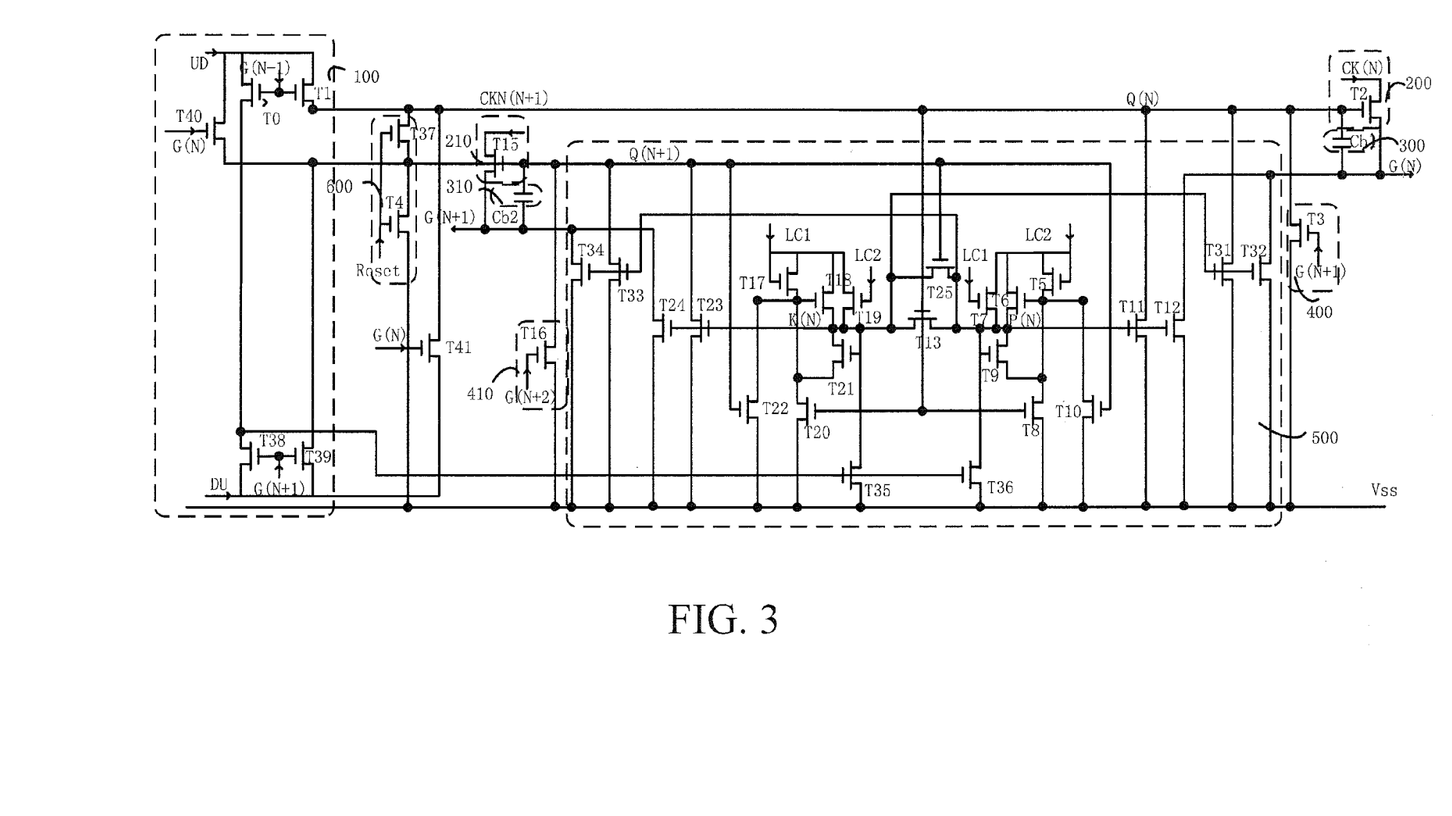
FIG. 3 is a schematic circuit diagram of a GOA unit in accordance with the third embodiment of the present invention.

With reference to FIG. 3, a GOA unit is illustrated according to the third embodiment of the present invention. The third embodiment of the present invention is a modified example of the GOA unit in accordance with the second embodiment of the present invention shown in FIG. 2, and it converts the single-stage bi-directional scanning circuit into a double-stage bi-directional scanning circuit. Accordingly, the GOA circuit as shown in FIG. 3 has a double-stage pull-up circuits 200 and 210, a double-stage pull down circuit 400 and 410, and a double-stage bootstrap capacitors 300 and 310 (Cb1 and Cb2), as well as key nodes, i.e. Q(N) and Q(N+1), to optimize the performance of GOA circuit.

Figure 4:
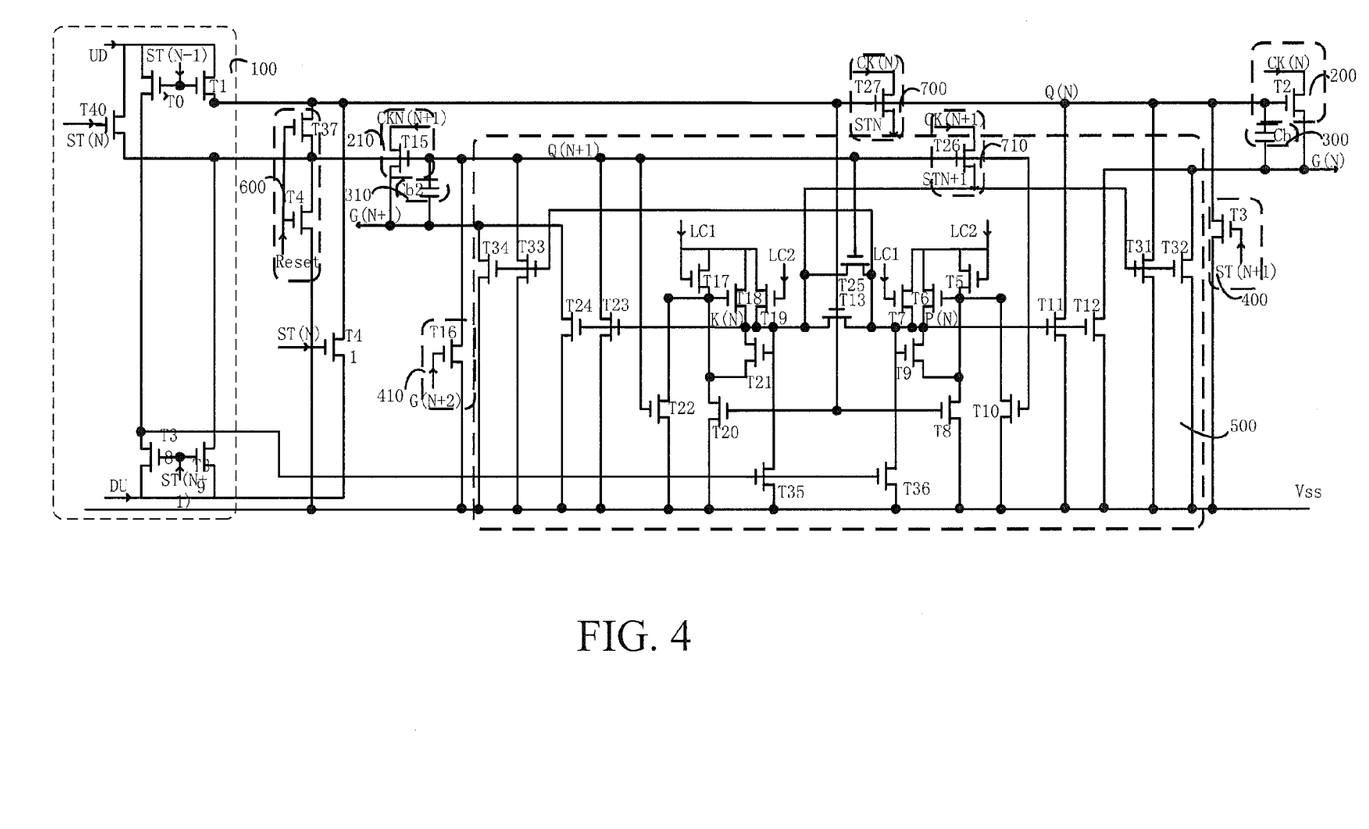
FIG. 4 is a schematic circuit diagram of a GOA unit in accordance with the example of the fourth embodiment of the present invention.

With reference to FIG. 4, a GOA unit is illustrated according to an example of the fourth embodiment of the present invention. In this example, the GOA unit is based on the third embodiment of the present invention shown in FIG. 3, and a modification of the GOA unit is focused on the pull-down holding circuit 500. The transistor T26 and the transistor T27, namely, circuits 700 and 710 in FIG. 7, are added to ensure the pull-down holding circuit 500 independence during output operation and to enhance the entire stability of the GOA circuit.

Figure 5:
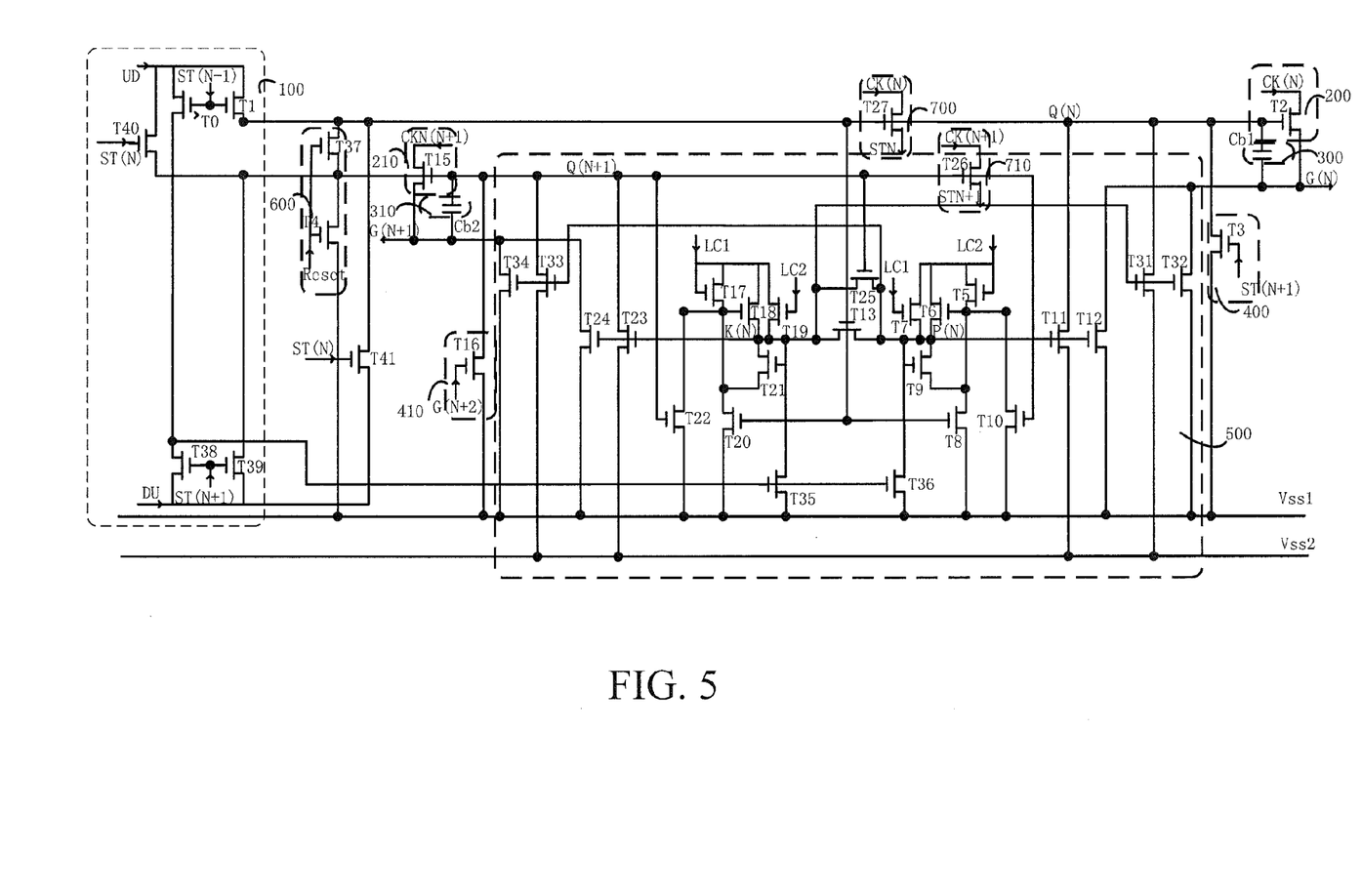
FIG. 5 is a schematic circuit diagram of a GOA unit in accordance with another example of the fourth embodiment of the present invention.

With reference to FIG. 5, a GOA unit is illustrated according to another example of the fourth embodiment of the present invention. In this example, the GOA unit is based on the fourth embodiment of the present invention shown in FIG. 4, and it converts the single DC low voltage input Vss into two separate DC low voltage inputs, i.e. Vss1 and Vss2. When the pull-down circuit 400 is responsible for pulling down the gate signal to be configured in the low electric potential at the first timing segment, i.e., the gate signals are turned off, the absolute values of Vss1 and Vss2 are both smaller than the clock signals, i.e, CKN, XCKN, LC1 or LC2 due to the two DC low voltage inputs, i.e. Vss1 and Vss2 with constant low electric potentials so that the pull-down of the electric potential of key node Q(N) can be enhanced to make a better mechanism for turning off the gate signals to ensure the stability of the GOA circuits for long term operation.

Figure 6:
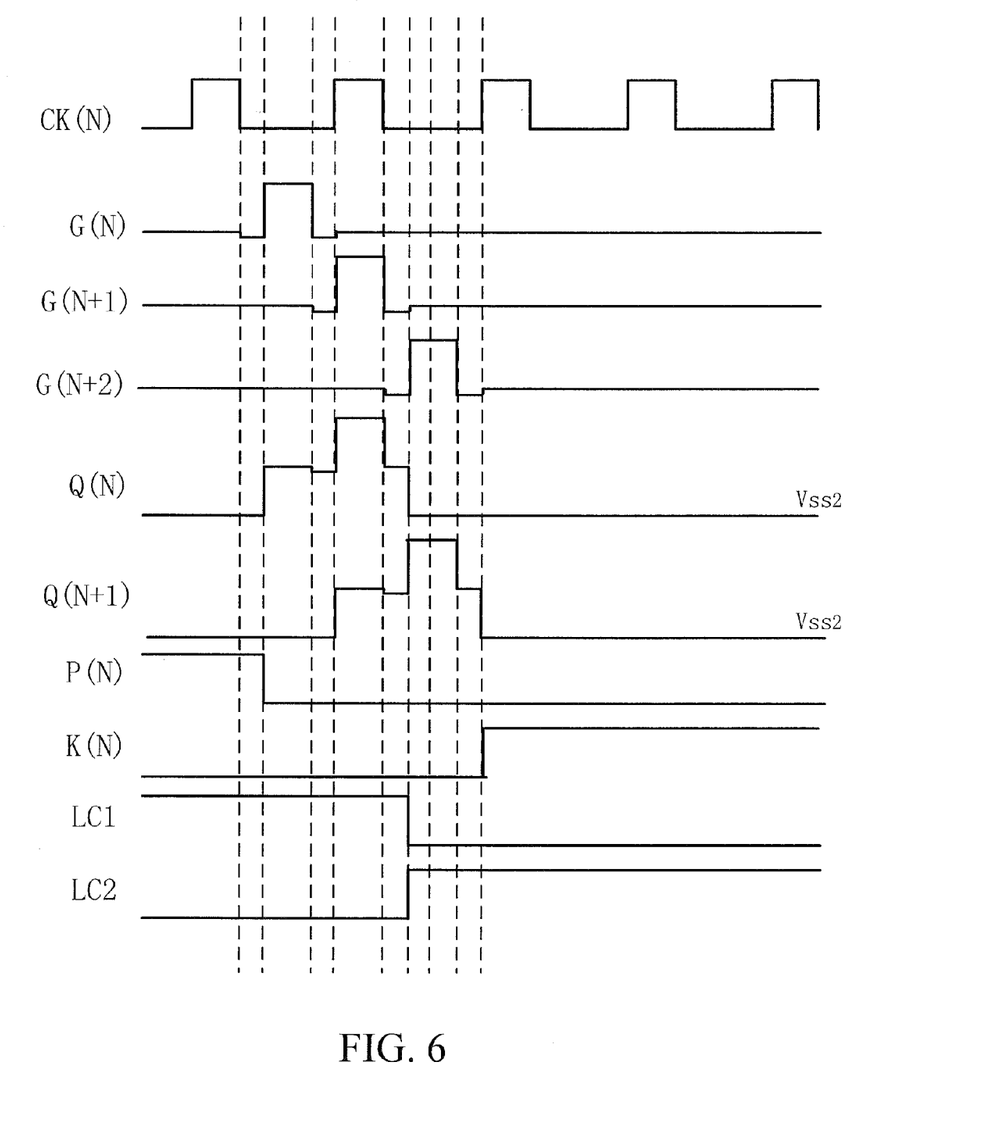
FIG. 6 is a timing diagram of GOA circuits operated in the forward scanning mode associated with another example of the fourth embodiment of the present invention.

FIG. 6 is a timing diagram of GOA circuits operated in the forward scanning mode associated with another example of the fourth embodiment of the present invention. As depicted in FIG. 6, CK(N) is a clock signal for driving the GOA circuit, and the waveforms of the clock pulse signal indicates that it is an implementation with duty cycle less than 50% so as to the key nodes, i.e. Q(N) and Q(N+1) charged through a couple of timing segments. However, the design of the duty cycle of the clock pulse signal depends on the physical needs for GOA circuits to adjust the pulse width, mainly on the grounds of stabilizing the current and voltage of the circuits. These waveforms in the timing diagram are observed for a case of an N-type transistor circuit, the positions referring to the high and the low electric potentials are all switched for the case of a P-type transistor circuit at the same timing.

Figure 7:
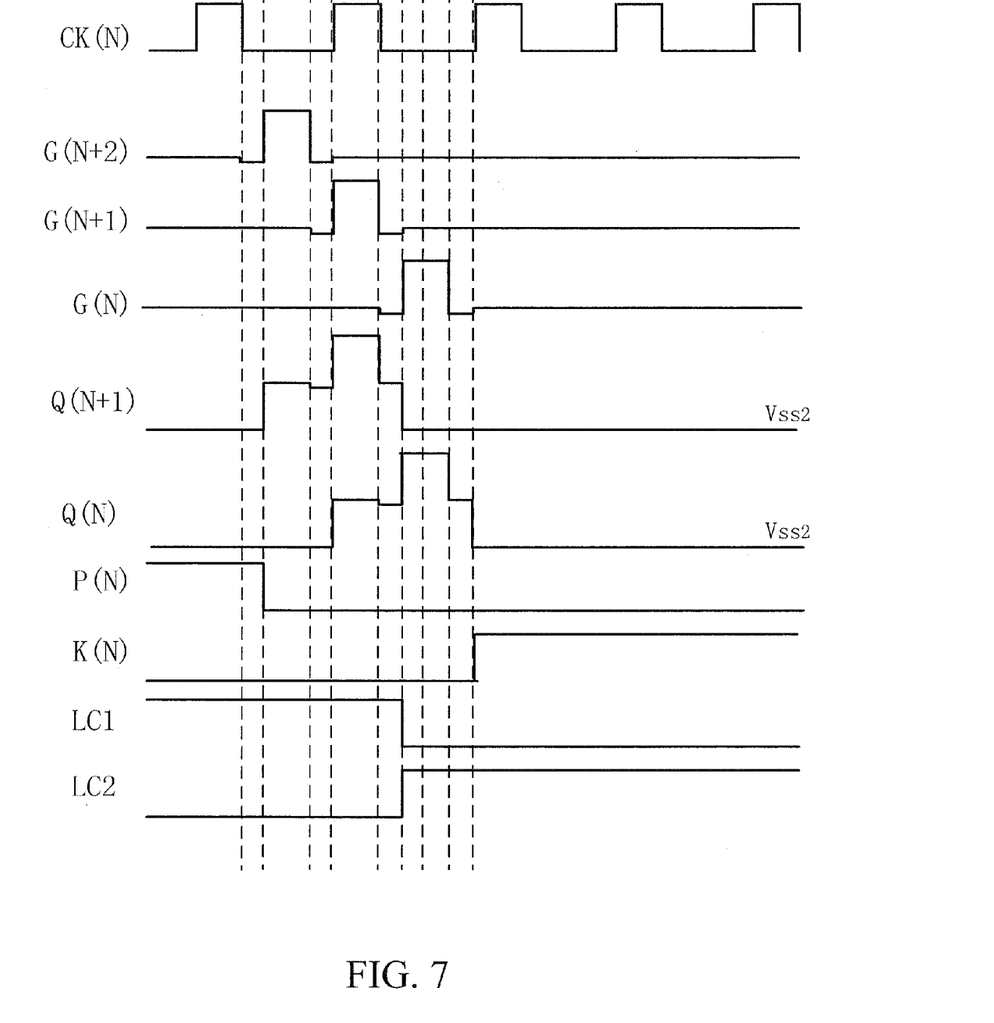
FIG. 7 is a timing diagram of GOA circuits operated in the backward scanning mode associated with another example of the fourth embodiment of the present invention.

FIG. 7 is a timing diagram of GOA circuits operated in the backward scanning mode associated with another example of the fourth embodiment of the present invention. These waveforms such as G(N+2), G(N+1), G(N), and the key nodes, Q(N) and Q(N+1) in the timing diagram, are observed, and their orders of timing are reverse to those shown in FIG. 6. The other timing waveforms are similar to those shown in FIG. 6.

In summary, the present invention controls scanning directions of an LCD display panel by introducing the forward scanning control signal and the backward scanning signal to the pull-up control circuit for determining to output the signals of GOA circuits in sequence downward or upward and thereby fulfilling diverse needs for scanning means of a display apparatus. Furthermore, the present invention can ensure that the pull-down holding circuit has appropriate electric potentials during operation or non-operation by depending on P(N) and K(N) of two circuit points of the pull-down holding circuit for adjustment as well as a novel scheme of three-segment voltage division such that the electric potentials of the key node Q(N) of the pull-up circuit and the gate output signal G(N) can be sustained effectively in Low electric potentials.

While the present invention has been described in connection with what is considered the most preferred embodiments, it is understood that this invention is not limited to the disclosed embodiments. It will be obvious that the same may be varied in many ways as shown in FIG. 1. Such variations are not to be regarded as a departure from the spirit and scope of the invention, and all such modifications as would be obvious to those skilled in the art are intended to be included within the scope of the following claims.

What is claimed is:

1. A bidirectional scanning GOA circuit for use in an LCD device including multiple cascaded GOA units, each of which generates one or more scanning signals outputted to the LCD device, the GOA unit comprising:

a pull-up control circuit including a forward scanning control signal input port configured to input a scanning control signal that controls the circuit to output in sequence of up-to-down stages, a backward scanning control signal input port configured to input a scanning control signal that controls the circuit to output in sequence of down-to-up stages, a plurality of gate signal input ports configured to receive a gate signal of a preceding-stage GOA unit and a gate signal of a succeeding-stage GOA unit, and an output port configured to output a pull-up control signal;

a pull-up circuit including an input port connected with a key node Q(N), configured to receive the pull-up control signal, a clock signal input port configured to receive a clock pulse signal and a gate signal output port of the current stage GOA unit, wherein the pull-up control signal is formed in accordance with the scanning control signals of the pull-up control circuit and the gate signal transmitted from either the preceding-stage GOA unit or the succeeding-stage GOA unit, upon forward scanning, the pull-up circuit is activated to charge the key node Q(N) when the gate signal transmitted from the preceding-stage GOA unit configured in a HIGH electric potential, and upon backward scanning, the pull-up circuit is activated to charge the key node Q(N) when the gate signal of the succeeding-stage GOA unit configured in a HIGH electric potential;

a bootstrap circuit including a bootstrap capacitor configured to secondarily lift a voltage of the key node Q(N);

a pull down circuit including a gate signal input port configured to receive the gate signal transmitted from the succeeding-stage GOA unit, a low voltage input port configured to input a DC low voltage, and an output port connected with the key node Q(N), and discharge the key node Q(N) when the gate signal input port receives the gate signal transmitted from the succeeding-stage GOA unit;

a pull-down holding circuit including a plurality of first clock signal input ports configured to input the first clock signals, a plurality of second clock signal input ports configured to input the second clock signals, and a plurality of connection points configured to connect the key node Q(N) with the signal output port of the GOA unit to sustain an electric potential of the key node Q(N) and the output signal of the GOA unit in LOW electric potentials, under the control of the first clock signal and the second clock signal, until the key node Q(N) is charged next time, wherein the signal output port of the GOA unit is coupled to a corresponding gate line; and a reset circuit configured for resetting the electric potential of the key node Q(N) to zero.

2. A GOA circuit for use in an LCD device including multiple cascaded GOA units, each of which generates one or more scanning signals outputted to the LCD device, the GOA unit comprising:

a pull-up control circuit including a first transistor and a second transistor connected in series, wherein a drain of the first transistor and a source of the second transistor are respectively connected with to introduce a scanning control signal that controls the circuit to output in sequence of up-to-down stages as well as a scanning control signal that controls the circuit to output in sequence of down-to-up stages, and a gate of the first transistor and a gate of the second transistor are respectively connected with to receive a gate signal of a preceding-stage GOA unit and a gate signal of a succeeding-stage GOA unit;

a pull-up circuit having a drain, which receives a of clock pulse signal, and a gate signal point, which is a key node Q(N) and is connected with the source of the first transistor and the drain of the second transistors, for charging a voltage of the key node Q(N) and controlling a timing of activating the pull-up circuit to output the gate signal of the N stage GOA unit in accordance with the scanning control signals and the received gate signal of the preceding-stage GOA unit or the succeeding-stage GOA unit, wherein the gate signal of the N stage GOA unit corresponds to a horizontal scanning line of the N stage GOA unit;

a bootstrap capacitor configured for secondarily lifting the voltage of the key node Q(N);

a pull down circuit having a drain and a source respectively connected with the key node Q(N) and a DC low voltage input, and a gate connected to receive the output signal of the succeeding-stage GOA unit for discharging the key node Q(N);

a pull-down holding circuit including a third transistor and a fourth transistor for inputting a first clock signal as well as a fifth transistor and a sixth transistor for inputting a second clock signal, wherein the first clock signal and the second signal are inverse with each other, and the key node Q(N) and the gate output signal are sustained in LOW electric potentials, under the control of the first clock signal and the second clock signal, until the key node Q(N) is charged next time; and a reset circuit configured for resetting the electric potential of the key node Q(N) to zero.

3. The GOA circuit according to claim 2, wherein the pull-down holding circuit further comprises a seventh transistor in which the gate is connected with a first circuit point P(N) as well as the source and the drain are respectively connected with the horizontal scanning line of the N-stage GOA unit and the DC low voltage input Vss; an eighth transistor in which the gate is connected with a first circuit point P(N), and the source and the drain are respectively connected with the key node Q(N) of the pull-up circuit and the DC low voltage input Vss; a ninth transistor in which the gate is connected with the key node Q(N), and the source and the drain are respectively connected with a second circuit point K(N) and the first circuit point P(N); a tenth transistor in which the gate is connected with the first circuit point P(N), and the source and the drain are respectively connected with the first clock signal CKN and the first circuit point P(N); an eleventh transistor in which the gate is connected with the second circuit point K(N), and the source and the drain are both connected with the second clock signal XCKN and the second circuit point K(N); a twelfth transistor in which the gate is connected with the second circuit point K(N), and the source and the drain are respectively connected with the key node Q(N) and the DC low voltage input; a thirteen transistor in which the gate is connected with the second circuit point K(N), and the source and the drain are respectively connected with the horizontal scanning line of the N-stage GOA unit and the DC low voltage input; a fourteenth transistor and a fifteenth transistor being in a series connection, in the fourteenth transistor in which the gate is connected with the first circuit point P(N) as well as the source and the drain are respectively connected with the first circuit point P(N) and the drain of the fifteenth transistor; the fifteenth transistor in which the gate is connected with the key node Q(N), and the source and the drain are respectively connected with the first circuit point P(N) and the DC low voltage input; a sixteenth transistor and a seventeen transistor being in a series connection, in the sixteenth transistor in which the gate is connected with the second circuit point K(N), and the source and the drain are respectively connected with the second circuit point K(N) and the drain of the seventeenth transistor; and the seventeenth transistor in which the gate is connected with the key node Q(N) of the pull-up circuit 200, and the source and the drain are respectively connected with the second circuit point K(N) and the DC low voltage input Vss.

4. The GOA circuit according to claim 2, wherein upon being operated in a forward scanning, the scanning control signal that output signals in sequence upward is configured in the HIGH electric potential while the scanning signal that output signals in sequence downward is configured in the LOW electric potentials, and the pull-up circuit is activated and the key node Q(N) is charged to output a gate signal, i.e. G(N), with a HIGH electric potential when the output signal of the preceding-stage GOA unit is in the HIGH electric potential and delivered to the current stage GOA unit.

5. The GOA circuit according to claim 2, wherein upon being operated in a backward scanning, the scanning control signal that output signals in sequence downward is configured in the HIGH electric potential while the scanning signal that output signals in sequence upward is configured in the LOW electric potentials, and the pull-up circuit is activated and the key node Q(N) is charged to output a gate signal, i.e. G(N), with a HIGH electric potential when the output signal of the succeeding-stage GOA unit is in the HIGH electric potential and delivered to the current stage GOA unit.

6. The GOA circuit according to claim 3 wherein the pull-down holding circuit further comprises two transistors added to enhance the electric potentials of the key node Q(N) to be charged at the first timing segment when the electric potentials of P(N) and K(N) are pulled down.

7. The GOA circuit according to claim 6, wherein the GOA unit converts into a double-stage GOA unit including a pull-up control circuit, pull-up circuits (200 and 210), pull down circuits (400 and 410), a pull-down holding circuit (500), a reset circuit, and bootstrap capacitors (300 and 310).

8. The GOA circuit according to claim 7, wherein the single DC low voltage input is changed to be two separate DC low voltage inputs.

9. An LCD display device comprising the GOA circuit for use in an LCD device according to claim 1.

* * * * *